United States Patent

Sasaki

Patent Number: 5,151,942
Date of Patent: Sep. 29, 1992

[54] CIRCUIT FOR MUTING NOISES FOR AN AUDIO AMPLIFIER

[75] Inventor: Yoshio Sasaki, Saitama, Japan

[73] Assignee: Pioneer Electronic Corporation, Tokyo, Japan

[21] Appl. No.: 706,696

[22] Filed: May 29, 1991

[30] Foreign Application Priority Data

Oct. 25, 1990 [JP] Japan .................. 2-287990

[51] Int. Cl.[5] ............................................. H04B 15/00
[52] U.S. Cl. ........................................ 381/94; 381/120; 330/51
[58] Field of Search ............. 455/221, 223; 330/51, 330/207 P; 381/94, 120, 28, 123

[56] References Cited

U.S. PATENT DOCUMENTS

| | | | |
|---|---|---|---|
| 3,840,820 | 10/1974 | Kawada | 330/51 |
| 3,889,202 | 6/1975 | Suzuki | 330/51 |
| 3,992,677 | 11/1976 | Tsurushima | 330/51 |
| 4,005,373 | 1/1977 | Salesky et al. | 330/51 |
| 4,181,895 | 1/1980 | Yoshida | 330/51 |
| 4,371,841 | 1/1983 | Eckert et al. | 330/51 |
| 5,029,005 | 7/1991 | Morris, Jr. | 330/51 |

FOREIGN PATENT DOCUMENTS 0230306  12/1984  Japan .................. 330/51

Primary Examiner—Forester W. Isen
Attorney, Agent, or Firm—Nikaido,, Marmelstein, Murray & Oram

[57] ABSTRACT

A stabilized power supply is provided for supplying a constant voltage to an audio amplifier. There are provided two comparators, a first comparator of which compares an output voltage of the stabilized power supply with a reference value to provide a first comparator signal when the output voltage coincides with the reference value. A second comparator is provided for comparing an output bias voltage of the amplifier with the output voltage of the stabilized power supply and for producing a second comparator signal when the output bias voltage coincides with the output voltage. A NAND gate is provided to be operated by the first and second comparator signals and a mute release signal so as to stop muting operation of the circuit.

3 Claims, 2 Drawing Sheets

CIRCUIT FOR MUTING NOISES FOR AN AUDIO AMPLIFIER

BACKGROUND OF THE INVENTION

The present invention relates to a circuit for muting a pop or a click noise which is generated when power is supplied to or cut off from an audio amplifier.

In an audio system, at the time when the power of the amplifier is turned on or off, a large pop or a click noise is emitted from a speaker. In order to prevent the noise, a muting circuit is provided in some types of audio systems.

FIG. 2 shows an example of conventional audio amplifier circuits, which has an amplifier 1, comparator 2 and a NAND gate 3. The non-inverting terminal of the amplifier 1 is connected to a signal input terminal 4 through a capacitor C1. The inverting terminal of the amplifier 1 is connected to the ground through a capacitor C2 and a resistor R1. The output of the amplifier 1 is connected to the inverting terminal thereof through a feedback resistor R2. The output of the amplifier 1 is connected to a signal output terminal 5 through a capacitor C3 and a resistor R3.

The non-inverting terminal of the amplifier 1 is further connected through a resistor R4 to a stabilized power supply 6 for supplying a constant voltage VREF. Bias voltage Vcc is applied to the input of the stabilized power supply 6 and the amplifier 1. The output of the power supply 6 is applied to one of the input terminals of the comparator 2. The other input terminal is applied with a reference voltage Vc1.

The output terminal of the comparator 2 is connected to one of the input terminals of the NAND gate 3. The other input terminal of the NAND gate 3 is connected to a mute terminal 7 through which a mute release signal is fed. The output terminal of the NAND gate 3 is connected to a base of a transistor Tr1 through a resistor R5. The collector of the transistor Tr1 is connected between the resistor R3 and the output terminal 5. Other resistors R6 to R8 and capacitors C4 and C5 are further provided in the circuit.

When a power switch for supplying the power for the circuit is turned on, the output voltage of the power supply 6 is increased with an increase of the bias voltage Vcc. On the other hand, a change of a bias voltage Vc of the amplifier 1 is delayed from that of the power supply 6 due to the charging current of the capacitors, and reaches the bias voltage Vcc. The output of the power supply 6 reaches the voltage VREF which is about one-half of the Vcc. Furthermore, the bias voltage Vc of the amplifier 1 reduces to the VREF from Vcc. The reducing change of the bias voltage Vc causes a signal to produce the click sound, which is output from the amplifier 1.

However, since a low level output is applied from the mute terminal 7, the level of the output of the NAND gate 3 is high, thereby rendering the transistor Tr1 conductive. Hence the output of the amplifier 1 is conducted to the ground through the transistor Tr1 so that the output of the terminal 5 is muted. Thus, no click sound is emitted from the speaker.

On the other hand, the comparator 2 compares the voltage VREF of the stabilized power supply 6 with the reference voltage Vc1. When the voltage VREF exceeds the reference voltage Vc1, the comparator 2 applied a high level output to the NAND gate 3. Thereafter, the mute release signal is fed to the NAND gate 3 through the mute terminal 7 so that the NAND gate 3 applied a low level output to the base of the transistor Tr1. As a result, the transistor Tr1 is rendered nonconductive, thereby stopping the muting operation.

However, because of the difference between time constants in the amplifier 1 and the stabilized power source 6, the transient response of the bias voltage of the amplifier 1 differs from the transient response of the stabilized power source 6. consequently, the output of the amplifier 1 may be generated after the transistor Tr1 becomes nonconductive so that the click sound may be heard.

SUMMARY OF THE INVENTION

The object of the present invention is to provide a circuit for reliably muting a pop and click sound which are generated when a power switch of an audio amplifier is turned on or off.

According to the present invention there is provided a circuit for muting noises for an audio amplifier circuit having an output terminal comprising an amplifier for amplifying an input signal, a stabilized power supply for supplying a constant voltage to the amplifier, a first comparator for comparing an output voltage of the stabilized power supply with a reference value and for producing a first comparator signal when the output voltage coincides with the reference value, and a second comparator for comparing an output bias voltage with the output voltage of the stabilized power supply and for producing a second comparator signal when the output bias voltage coincides with the output voltage.

Gate means is provided to respond to the first and second comparator signals and to a mute release signal for producing a mute release control signal, and for producing a mute control signal when either the first and second comparator signals or the mute release signal is not applied.

In response to the mute control signal, a grounding circuit operates to ground the output of the amplifier to attenuate an output to be produced from the output. In response to the mute release control signal, the grounding of the output of the amplifier is cut.

In an aspect of the invention, the gate means is a NAND gate, and the grounding circuit includes a transistor becoming conductive in response to the mute control signal, thereby grounding the output of the amplifier.

DETAILED DESCRIPTION OF THE PREFERRED EMBODIMENT

Figure 1:
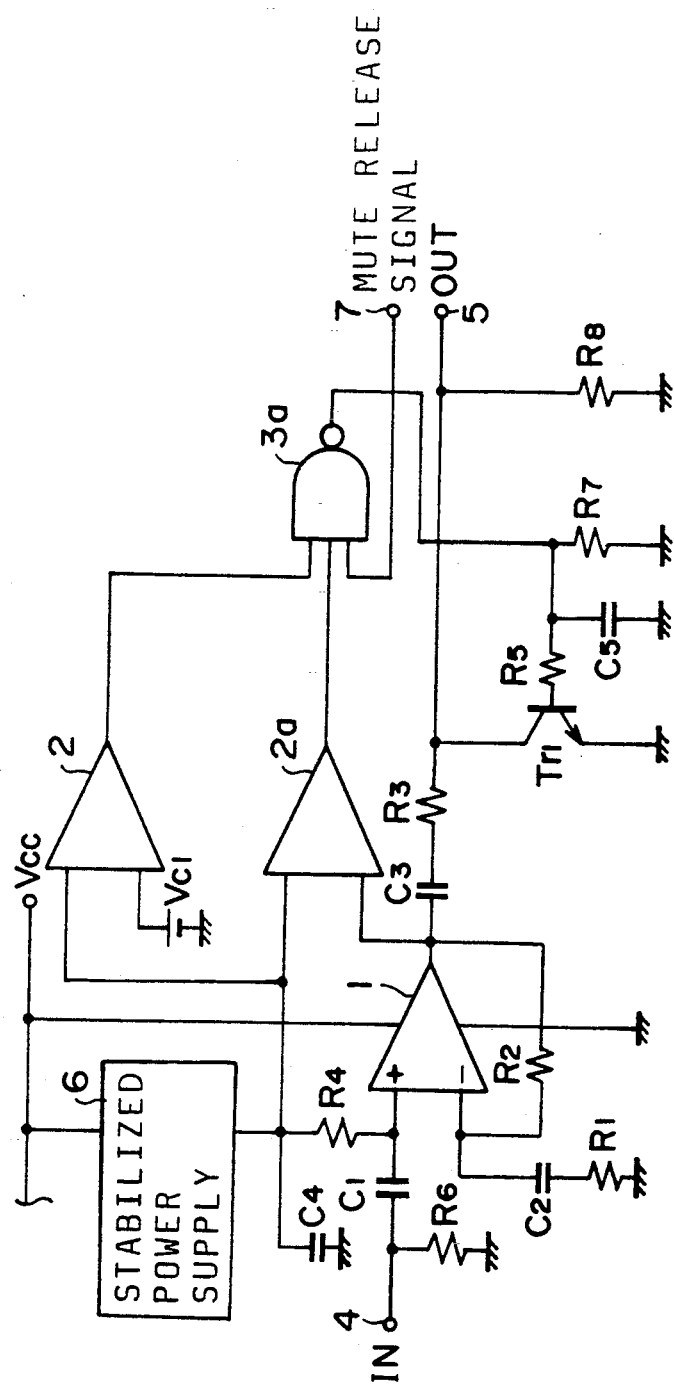
FIG. 1 is a diagram showing an audio amplifier circuit according to the present invention.
Figure 2:
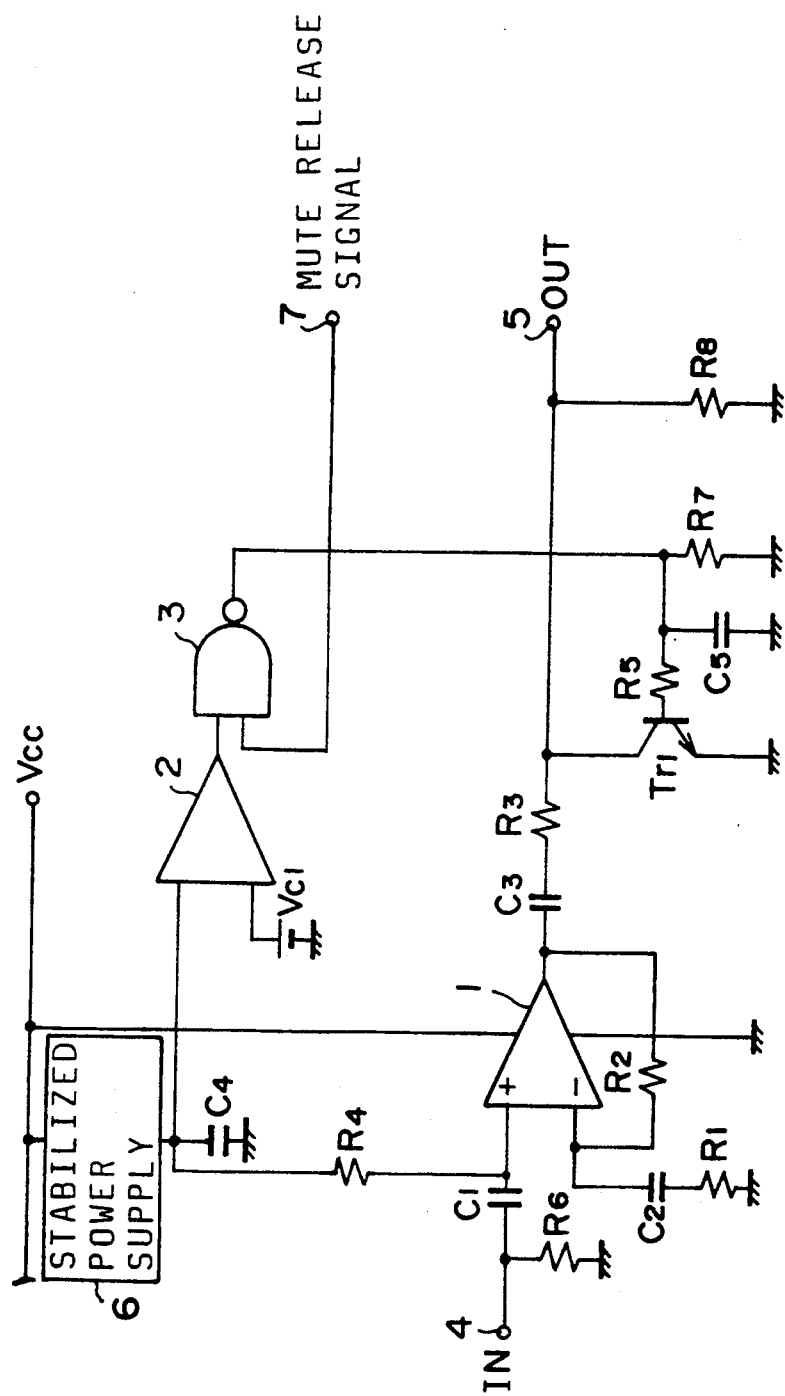
FIG. 2 is a diagram showing a conventional audio amplifier circuit.

Referring to FIG. 1, a muting circuit of the present invention is similar to the conventional circuit shown in FIG. 2 and the same numerals as FIG. 2 designate the same parts in FIG. 1.

The amplifier circuit has the amplifier 1, comparators 2 and 2a, and a NAND gate 3a. The output voltage VREF of the stabilized power supply 6 is applied to one of the input terminals of each of the comparators 2 and 2a. The other input of the comparator 2 is applied with the reference voltage Vc1 so as to compare the voltage VREF with the reference voltage Vc1. On the other hand, the other input terminal of the comparator 2a is connected to the output terminal of the amplifier 1 so as to compare the voltage VREF with the output bias voltage of the amplifier 1. When the voltages coincide with each other within a predetermined range, the comparator 2a produces a high level output. The output terminals of the comparators 2 and 2a are connected to the NAND gate 3a to which the mute terminal 7 is also connected.

The non-inverting terminal of the amplifier 1 is connected to the signal input terminal 4 through the capacitor C1. The inverting terminal of the amplifier 1 is connected to the ground through the capacitor C2 and the resistor R1. The output of the amplifier 1 is connected to the inverting terminal thereof through the feedback resistor R2. The output of the amplifier 1 is connected to the signal output terminal 5 through the capacitor C3 and the resistor R3.

The non-inverting terminal of the amplifier 1 is further connected to the stabilized power supply 6 through the resistor R4. The bias voltage Vcc is applied to the input of the stabilized power supply 6 and the amplifier 1. The output terminal of the NAND gate 3a is connected to the base of the transistor Tr1 through the resistor R5. The collector of the transistor Tr1 is connected between the resistor R3 and the output terminal 5. Other resistors R6 to R8 and capacitors C4 and C5 are further provided in the circuit.

When a power switch for system is turned on, the output voltage of the power supply 6 is increased with an increase of the bias voltage Vcc. The bias voltage Vc of the amplifier 1 also increases and reaches the bias voltage Vcc and further to the voltage VREF. Since a low level output is applied from the mute terminal 7, the level of the output of the NAND gate 3 is high, thereby rendering the transistor Tr1 conductive. Hence the output of the amplifier 1 is conducted to the ground through the transistor Tr1 so that the output of the terminal 5 is muted. Thus, no click sound is emitted from the speaker.

On the other hand, the comparator 2 compares the voltage VREF of the stabilized power supply 6 with the reference voltage Vc1. When the voltage VREF exceeds the reference voltage Vc1, the comparator 2 applies a high level output to the NAND gate 3a. At the same time, the comparator 2a compares the bias voltages of the power supply 6 and the amplifier 1 with each other. When the voltages are within a predetermined range, and further coincide with each other, a high level output is applied to the NAND gate 3a. Thereafter, the mute release signal is fed to the NAND gate 3a through the mute terminal 7 so that the NAND gate 3a applies a low level output to the base of the transistor Tr1. As a result, the transistor Tr1 is rendered nonconductive, thereby stopping the muting operation.

If the output bias voltage of the amplifier 1 does not coincide with the voltage VREF, the transistor Tr1 stays conductive although the voltage VREF may exceed the reference voltage Vc1 and the mute release signal may be fed. Thus the output of the amplifier is connected to the ground through the transistor Tr1 so that the output signal from the terminal 5 is muted.

When the power switch of the amplifier is turned off, the capacitor C5 rapidly discharges through the resistor R5. Hence the transistor Tr1 quickly becomes conductive, thereby muting the output from the output terminal 5.

In accordance with the present invention, although there may be the time difference between the voltage of the amplifier and the voltage of the stabilized power supply when the power is applied to or cut off from the amplifier, a pop and a click noise are reliably prevented from emitting by muting the output of the amplifier.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A circuit for muting noises for an audio amplifier circuit having an output terminal comprising:
   an amplifier for amplifying an input signal;
   a stabilized power supply for supplying a constant voltage to the amplifier;
   a first comparator for comparing an output voltage of the stabilized power supply with a reference value and for producing a first comparator signal when the output voltage coincides with the reference value;
   a second comparator for comparing an output bias voltage of the amplifier with the output voltage of the stabilized power supply and for producing a second comparator signal when the output bias voltage coincides with the output voltage;
   gate means responsive to the first and second comparator signals and to a mute release signal for producing a mute release control signal, and for producing a mute control signal when either of the first or second comparator signals or the mute release signal is not applied; and
   a grounding circuit responsive to the mute control signal for grounding the output of the amplifier to attenuate an output to be produced from the output and responsive to the mute release control signal for cutting the grounding of the output of the amplifier.

2. The circuit according to claim 1 wherein the gate means is a NAND gate.

3. The circuit according to claim 2 wherein the grounding circuit includes a transistor becoming conductive in response to the mute control signal, thereby grounding the output of the amplifier.

* * * * *